FABRICATION OF SILICON DEVICES

Filed March 22, 1957

INVENTORS R. A. LOGAN
A. J. PETERS
M. TANENBAUM
BY Arthur J. Torsiglieri
ATTORNEY United States Patent Office 2,879,190

Patented Mar. 24, 1959

2,879,190

FABRICATION OF SILICON DEVICES

Ralph A. Logan, Morristown, Arthur J. Peters, South Plainfield, and Morris Tanenbaum, Madison, N.J., assignors to Bell Telephone Laboratories, Incorporated, New York, N.Y., a corporation of New York Application March 22, 1957, Serial No. 647,908

10 Claims. (Cl. 148—1.5)

Figure 1:
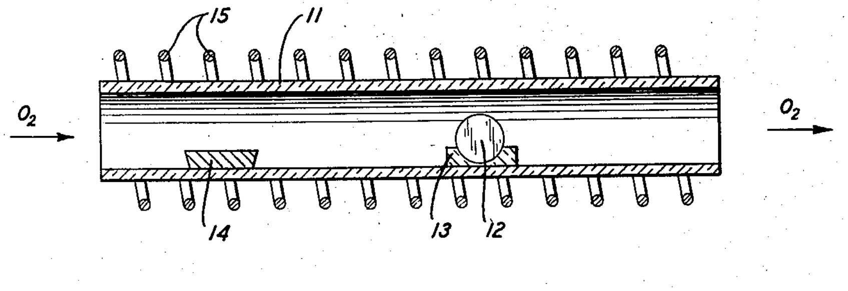

This invention relates to the fabrication of semi-conductive devices and more particularly to silicon devices.

An object of this invention is to facilitate the formation in a silicon crystal of an N-type region underlying a surface layer which is P-type.

A related object is to facilitate the fabrication of silicon junction transistors of the PNP and PNIP type.

In an application Serial No. 516,674, filed June 20, 1955, by C. S. Fuller and M. Tanenbaum, there is described a technique for the formation in a silicon crystal of a double layer formed by superposed regions of opposite conductivity type. The technique described involves either the successive or the simultaneous diffusion of acceptors and donors into the crystal by heating it in a suitable ambient. This technique has been found to be well adapted for use when the outer region of the double layer is to be N-type and the inner region P-type, as is desirable in the fabrication of NPN and NPIN transistors. However, the use of this technique has been found hitherto not to be completely satisfactory for forming in a silicon crystal a double layer in which the outer of the two layers is P-type and the inner N-type. Several factors are responsible. First, because the familiar group V donors all have a diffusion velocity lower than those of the familiar group III acceptors, it is impossible to form the desired double layer in which the inner region is N-type by simultaneous diffusion of the donors and acceptors, and it becomes necessary to utilize instead successive diffusion steps. Moreover, the familiar group V donors all have diffusion velocities in silicon which are so low that long heating times at elevated temperatures are necessary to effect adequate penetration into the silicon crystal.

Heating of silicon for long times at elevated temperature is usually found undesirable because it results in deterioration of the electrical quality of the silicon. As a consequence, the double diffusion technique has not proved especially attractive for use in the fabrication of PNP and PNIP silicon transistors.

The double diffusion technique is important because it makes possible fabrication of transistors with excellent high frequency properties. Since it is often desirable to have PNP and PNIP silicon transistors of good high frequency properties to complement NPN and NPIN units in specific circuit applications, it is advantageous to have a double diffusion process which is applicable to the fabrication of PNP and PNIP units. The present invention in its preferred form provides such a process.

The present invention is based on the discovery that oxygen has a diffusion velocity in silicon at least as high as the usual acceptors and can serve as a stable donor therein after the silicon has been appropriately heat treated. This discovery in one important application now makes convenient the fabrication of PNP and PNIP junction transistors by a double diffusion technique with the advantages associated with the use of this technique. In particular, it is characteristic of the preferred form of the invention that oxygen is introduced into a P-type or intrinsic silicon crystal by heating the crystal in an oxygen ambient at a temperature and for a time to form an oxygen-rich region in the crystal, and the crystal is thereafter heated to a temperature between 300° C. and 500° C. for a time adequate to affect conversion of the oxygen-rich region to N-type. Advantageously before the heating step used to affect conversion of the oxygen-rich region, there is also formed in the crystal an acceptor-rich surface layer which overlies the oxygen-rich region and which remains P-type in spite of the conversion heating step.

In an illustrative embodiment of the invention, a P-type silicon wafer was heated for an hour at 1300° C. in an ambient of oxygen and boron trioxide to form therein a boron-rich surface layer and an oxygen-rich intermediate layer. Thereafter, the wafer was heated for a number of hours at 450° C. which resulted in a conversion of the oxygen-rich intermediate layer to N-type. Separate low resistance connections were thereafter made to the P-type body material, the N-type layer and the P-type boron-rich surface layer.

Figure 2:
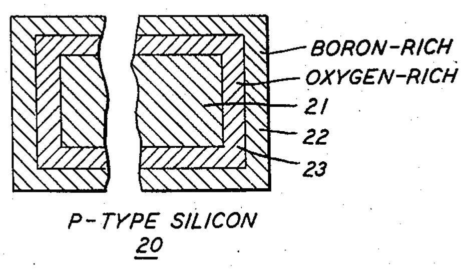
Figure 3:
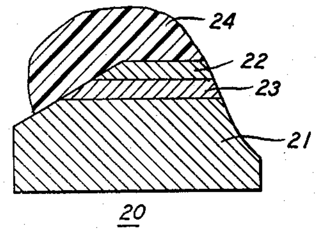
Figure 4:
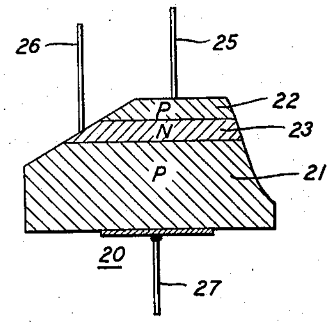

The invention will be better understood from the following more detailed description taken in conjunction with the accompanying drawing in which:

Fig. 1 shows apparatus suitable for carrying out the diffusion step characteristic of the preferred form of the invention; and Figs. 2, 3 and 4 each show a silicon unit at various stages in its preparation for use in a PNP transistor in accordance with the invention.

With reference now to the drawing, in Fig. 1 there is shown one form of apparatus suitable for carrying out the oxygen diffusion step characteristic of the invention. A quartz lined elongated tube 11, of which a longitudinal section is shown, having an inner diameter of about one inch serves as the diffusion furnace. The silicon crystal 12 to be treated is supported on a quartz mount 13 in the furnace in a manner that leaves clearly exposed the large area surfaces of the crystal. There is also positioned within the furnace a platinum boat 14 within which there may be positioned in solid form an acceptor which also is to be diffused into the crystal in accordance with a preferred form of the invention. Provision is made for flowing oxygen through the furnace at a controlled rate, the direction of flow being such that the oxygen flows past the boat 14 before reaching the mount 13. A heating coil 15 surrounds the tube 11 for controlling the temperature of the furnace. In some cases the heating coil is advantageously arranged to provide two different temperature zones within the furnace, the mount for the silicon and the boat for the acceptor being in different zones. This permits increased control of the acceptor vapor pressure and in turn the surface concentration of the acceptor and to a lesser extent its depth of penetration which results from the diffusion step.

It is advantageous that the silicon used be as free of oxygen as possible before the diffusion treatment. To this end, it is advantageous that the silicon be prepared in an ambient free of oxygen by the floating zone technique described in application Serial No. 326,561, filed December 12, 1952, by H. C. Theuerer. This technique is characterized by the fact that the silicon is zone refined to high purity and formed into a single crystal while being suspended free of any surrounding crucible.

In an illustrative embodiment of the invention, a silicon crystal approximately 250 mils by 250 mils and 60 mils thick was cut from a larger P-type crystal which was prepared as described above and had a specific resistivity of 50 ohm-centimeter. After cutting, the crystal was sandblasted and etched in the manner known to workers in the art to remove the damaged surface material and leave a smooth level surface. This crystal was then mounted in the furnace. To serve as the acceptor, about one-half a gram of high purity boron trioxide ($B_2O_3$) was placed in the platinum boat. The furnace was heated to about 1300° C. and high purity oxygen was then flowed therethrough at a rate of about 1500 cubic centimeters per minute. This heating treatment was continued for approximately an hour and the wafer was then removed from the furnace and allowed to cool. From the results of other experiments, it was estimated that this heating treatment produced penetration to a depth of about .6 mil for the boron and about .8 mil for the oxygen, the difference in penetration resulting from the higher diffusion velocity in silicon of the oxygen.

The wafer was then reheated at 450° C. for about 48 hours in a conventional furnace with air as the ambient. Such heating, even though for an extended time, is at a temperature sufficiently low that little deterioration of the electrical quality of the silicon results. This second heating appears to be necessary for conversion to N-type of the intermediate oxygen-rich region between the boron-rich surface layer and the uncontaminated P-type bulk. The boron-rich surface layer remained P-type under the conditions described.

The resulting structure is shown in cross section in Fig. 2. It is necessary to show the diffused layers on an enlarged scale. The silicon crystal 20 has a P-type bulk portion 21 and a boron-rich P-type surface layer 22 and intermediate therebetween an oxygen-rich N-type region 23.

The top surface of the crystal was then lapped at an angle to expose a portion of the N-type region to facilitate making connection thereto. Wax 24 was then coated over the beveled edge and a portion of the top surface, and the crystal was then etched in a conventional manner for a time sufficient to remove the diffused layers from the exposed surface to provide a structure of the type shown in cross section in Fig. 3.

After removal of the wax, separate low resistance connections were then made to the three regions in a manner known to workers in the art. The result is shown in Fig. 4. Phosphor-bronze point electrodes were pressed into the diffused P-type and N-type layers to serve as the emitter and base electrode connections 25, 26 respectively. A gold-plated tab was electroplated to the back surface of the wafer to serve as the collector 27. It is, of course, feasible to form the various connections by alloying suitable electrodes. In particular, it is possible to form the base connection in the manner described in the previously identified Fuller-Tanenbaum application by alloying a gold-antimony layer through the P-type emitter surface layer for connecting to the intermediate N-type layer.

It will be obvious to a worker in the art that various modifications are possible in the specific process described. For example, a wafer having a useful double layer was prepared by first heating the crystal for 30 minutes in an ambient including oxygen and free of acceptors at 1300° C. and then reheating it for the same time and at the same temperature in an ambient including both oxygen and boron. Moreover, it is feasible to diffuse the acceptor from an ambient free of oxygen into the crystal in a first heating step and then to diffuse oxygen from an ambient either including or free of the acceptor in a second heating step, depending on the higher diffusion velocity of the oxygen to secure deeper penetration of the oxygen. In a process of this kind, the first heating step may be at a low temperature to form only a very shallow acceptor-rich surface region. Moreover, any of various gases may be used as a carrier for the acceptor.

The use of acceptors other than boron, such as indium, gallium and aluminum is also feasible. As previously indicated, for control of the vapor pressure of the acceptor, two temperature zones may be used in the furnace described. It is important to insure a surface concentration of the acceptor diffused sufficiently high that there remains a P-type surface layer after the conversion heating step. Moreover, the acceptor may be supplied for diffusion to the furnace in vapor form directly.

The temperature at which the one or more diffusion steps may be carried out also encompasses a wide range. However, it is generally advantageous to include for the acceptor diffusion heating at a temperature of between 1000° C. and 1400° C. to avoid too long diffusion times. Similarly, temperatures in this range are also preferred for the oxygen diffusion to insure adequate penetration of the crystal by the oxygen in reasonable diffusion times.

For effecting conversion of the oxygen-rich region to N-type, heating in the range between about 300° C. and 500° C. is important. The length of time the wafer is heated at this temperature determines to some extent the width of the N-type layer formed. This characteristic makes it easy to control the width of the layer formed. In general, heating for at least half an hour in this temperature range seems important for forming N-type layers of useful thicknesses in the interior. However, after this conversion step prolonged heating of the crystal at temperatures much above 500° C. is usually to be avoided, since this has a tendency to nullify the effect of the conversion heating step and reconvert the oxygen-rich region to P-type. As a consequence, the conversion heating step should follow other steps involving heating at high temperatures, such as any diffusion steps. Extended heating at high temperatures may be used, however, when it is desired to undo the effects of the conversion heating.

It can further be appreciated that the technique for forming double layers of the kind described also has application in the formation of structures such as PNPN, PNIP, and PNIN wafer. For example, if there be formed an N-type alloy connection to the exposed P-type bulk of the wafer shown in Fig. 3, a PNPN structure would result. Alternatively, the diffusion technique described can be used on an intrinsic wafer to form a PNINP structure. The diffused layers may then be removed from one face to expose the intrinsic bulk portion. Thereafter, by suitably alloying either an acceptor or a donor into such face, there can be formed either a PNIP or a PNIN structure. Moreover, the geometry of the various zones may be adjusted as desired by suitable masking. In addition, masking may be used to facilitate the manufacture of structures of these kinds. In particular, the surface oxide layer formed by heating in oxygen may be used as a mask in such processes.

Moreover, it is possible to form a single N-type surface layer on P-type silicon by diffusing in oxygen alone as described and then reheating in the 300° C.–500° C. range to convert the oxygen-rich region to N-type. In crystals treated in this fashion, it is possible to form a P-type skin if before reheating at the conversion temperature range, the crystal is reheated in a vacuum for a time sufficient to diffuse enough oxygen out of the surface of the crystal that heating in the conversion range converts only the oxygen-rich interior region and not the surface layer depleted by the vacuum heating.

Additionally, in some instances the introduction of oxygen may be used to increase the conductivity of material already N-type. For example, oxygen may be diffused into a crystal already including a P–N junction to increase the conductivity of the N-type region near the junction to vary the breakdown characteristic of the junction. Control of the conversion heating time may be used to control the breakdown characteristic to narrow limits in this way.

Moreover, the oxygen may be introduced in various ways. In particular, heating in water vapor at diffusion temperatures will result in an introduction of oxygen. Additionally, there may be formed a glass oxide film on the crystal by various means and the crystal heated thereafter for introducing oxygen from the film into the crystal.

What is claimed is:

1. The process of forming a silicon P–N–P transistor comprising the steps of heating a P-type silicon crystal for at least an hour at a temperature between 1000° C. and 1400° C. in an ambient which includes oxygen and boron for forming in the crystal a boron-rich surface layer and an oxygen-rich region intermediate between said surface layer and the P-type bulk, heating the crystal for at least half an hour at a temperature between 300° C. and 500° C. for converting the oxygen-rich region to N-type, and making separate low resistance connections to the boron-rich surface layer, the N-type region and the P-type bulk of the crystal.

2. The proces of forming a double layer in a silicon crystal comprising the steps of heating the crystal for at least an hour at a temperature between 1000° C. and 1400° C. in an ambient which includes oxygen and an acceptor having a diffusion velocity in silicon lower than that of the oxygen for forming in the crystal an acceptor-rich surface layer and an oxygen-rich region underlying such layer, and thereafter heating the crystal for at least half an hour at a temperature between 300° C. and 500° C. for converting the oxygen-rich region to N-type.

3. The process of forming a double layer in a silicon crystal comprising the steps of heating the crystal in an ambient which includes oxygen and an acceptor having a diffusion velocity lower than that of the oxygen for a time and at a temperature for forming in the crystal an acceptor-rich surface layer and an oxygen-rich region underlying such layer, and thereafter heating the crystal at a temperature between 300° C. and 500° C. for converting the oxygen-rich region to N-type.

4. The process for forming a double layer in a silicon crystal comprising the steps of heating the crystal in turn in an ambient which includes oxygen and is free of an acceptor and in an ambient which includes oxygen and an acceptor for times and at temperatures for forming in the crystal an acceptor-rich surface layer and an oxygen-rich region underlying such surface layer, and thereafter heating the crystal for at least half an hour at a temperature between 300° C. and 500° C. for converting the oxygen-rich region to N-type.

5. The process for forming a double layer in the silicon crystal which comprises the steps of forming by diffusion in the crystal a surface layer rich in an acceptor impurity and underlying such surface layer a region rich in oxygen, and then heating the crystal at a temperature between 300° C. and 500° C. for converting the oxygen-rich region to N-type.

6. The process for forming an N-type layer in a P-type silicon crystal comprising the steps of heating the crystal at a temperature between 1000° C. and 1400° C. in an oxygen ambient for diffusing oxygen into the crystal and thereby forming an oxygen-rich region therein, and then reheating the crystal at a temperature between 300° C. and 500° C. for a time for converting the oxygen-rich region to N-type.

7. The process for forming an N-type layer in a P-type silicon crystal comprising the steps of heating the silicon crystal at a temperature of between 1000° C. and 1400° C. in an oxygen ambient for at least an hour for diffusing oxygen into the interior of the crystal, and then reheating the crystal at a temperature between 300° C. and 500° C. for at least half an hour for converting the oxygen-rich region to P-type.

8. The process of forming a silicon PNP transistor comprising the steps of heating a P-type silicon crystal in an ambient which includes oxygen and an acceptor for a time and at a temperature for forming in the crystal an acceptor-rich surface layer and an oxygen-rich region intermediate between said surface layer and the bulk of the crystal, heating the crystal at a temperature between 300° C. and 500° C. for a time to convert the oxygen region to N-type, and forming separate low resistance connections to the acceptor-rich layer, the N-type region, and the bulk.

9. The process of forming a PNP silicon transistor comprising the steps of forming by diffusion in a P-type crystal a surface layer in which an acceptor is predominant on an oxygen-rich region intermediate between the bulk of the crystal and the acceptor-rich surface layer, heating the crystal at between 300° C. and 500° C. for converting the oxygen-rich region to N-type, and forming separate low resistance connections to the acceptor-rich surface layer, the N-type region and the bulk of the crystal.

10. The process of forming an N-type layer selectively in the interior of a silicon body comprising the steps of forming by diffusion an oxygen-rich region in the interior of the body underlying an acceptor-rich surface layer and heating the body in the conversion temperature range for a time to effect conversion of the oxygen-rich region to N-type.

References Cited in the file of this patent

UNITED STATES PATENTS

| | | |
|---|---|---|
| 2,603,692 | Scaff et al. | July 15, 1952 |
| 2,743,200 | Hannay | Apr. 24, 1956 |
| 2,785,096 | Adcock | Mar. 12, 1957 |
| 2,802,760 | Derick et al. | Aug. 13, 1957 |